US012808904B2

(12) United States Patent
Grno

(10) Patent No.: US 12,808,904 B2
(45) Date of Patent: Nov. 24, 2026

(54) PLANAR SENSOR AND ELECTRIC CURRENT SENSOR

(71) Applicant: Ladislav Grno, Bratislava (SK)

(72) Inventor: Ladislav Grno, Bratislava (SK)

(73) Assignee: APPLIED INVEST s.r.o., Bratislava (SK)

( * ) Notice: Subject to any disclaimer, the term of this patent is extended or adjusted under 35 U.S.C. 154(b) by 130 days.

(21) Appl. No.: 19/002,981

(22) Filed: Dec. 27, 2024

(65) Prior Publication Data

US 2025/0389755 A1 Dec. 25, 2025

(51) Int. Cl.
*G01R 15/18* (2006.01)
*G01R 19/00* (2006.01)

(52) U.S. Cl.
CPC ......... *G01R 15/18* (2013.01); *G01R 19/0092* (2013.01)

(58) Field of Classification Search
CPC ... G01R 15/18; G01R 15/185; G01R 19/0092
See application file for complete search history.

(56) References Cited

U.S. PATENT DOCUMENTS

| | | | | | |
|---|---|---|---|---|---|
| 5,517,104 | A * | 5/1996 | Kawakami | G01R 19/20 | 324/117 R |
| 5,523,677 | A * | 6/1996 | Kawakami | G01R 15/185 | 330/8 |
| 2008/0303511 | A1* | 12/2008 | Grno | G01R 15/181 | 324/117 R |
| 2014/0333284 | A1* | 11/2014 | Dames | G01R 3/00 | 29/602.1 |

* cited by examiner

*Primary Examiner* — Eman A Alkafawi
*Assistant Examiner* — Suresh K Rajaputra
(74) *Attorney, Agent, or Firm* — Falcon Rappaport & Berkman LLP

(57) ABSTRACT

A planar electric current sensor is provided, including: a flexible strip; an excitation planar structure comprising transverse segments of electrically conductive material above and below the flexible strip along its length, the outer surfaces of which are galvanically isolated from each other and which are first connecting elements conductively connected in series with each other and which with the transverse segments, surround the flexible strip and form the excitation winding; a sensing planar structure comprising transverse segments of electrically conductive material above and below the flexible strip, distributed along its length, the outer surfaces of which are galvanically isolated from each other and which are conductively connected in series with each other by second connecting elements which with the transverse segments together surround the flexible strip and form the sensing winding; the excitation planar structure, the sensing planar structure and the flexible strip are galvanically isolated from each other.

9 Claims, 5 Drawing Sheets

PLANAR SENSOR AND ELECTRIC CURRENT SENSOR

FIELD OF THE INVENTION

The present application relates to arrangement of the planar sensor and electric current measurement sensor. The present application falls into the field of electrical engineering.

BACKGROUND OF THE DISCLOSURE

Sensors and electric current sensors capable of measurement of the DC current component are essential components of control and monitoring systems in industrial DC applications such as control of motors, power sources, welding sources, electrolysis, electroplating, etc. Current amplitudes in such or other low-power applications can occur in the range of fractions of milliamperes up to hundreds of kiloamperes.

Sensors for small currents are mostly based on a resistive shunt connected in the current path, and the voltage drop across this shunt is a measure for the current flowing through this current path. The disadvantage of this approach is the discontinuity of the current path and the additional power loss in the shunt. For this reason, this method is limited to currents on the order of fractions of kiloamperes. The disadvantage of shunt systems is also that the current circuit must be disconnected to install the shunt.

Another method of current measurement is based on using the magnetic field created by the electric current as a measure for measuring current. The magnetic field of the conductor through which the measured current flows is concentrated by a magnetic circuit of magnetically soft material into the gap in which the sensor sensing the magnetic field is placed. The sensor can use various magnetic field sensing principles such as Hall effect, magnetoresistance, nonlinearity of the magnetization characteristic of the magnetically soft material, dependence of the high frequency impedance on the magnetic field, etc.

Since magnetic field sensors are generally non-linear elements, the sensor must be provided with the additional electronic feedback control to achieve higher accuracy. This control system needs high power for higher measured currents. This known compensation method is based on measurement of the magnetic flux level in the core gap to compensate for the primary current by the secondary current in the secondary winding of the measuring transformer, so that the magnetic flux in the gap is zero.

In this case, the compensating secondary current is a measure for the primary current. The disadvantage of this well-known technique is that it is sensitive to distortion of the secondary current signal waveform due to saturation of the magnetic core of the transformer. The disadvantage of the Hall probe used as a zero level sensor is its non-negligible and erratic offset.

The similar method is described in U.S. Pat. No. 5,552,979. According to this known method, the magnetic flux in the core of the transformer is calculated from the voltage across the secondary winding of the transformer and is permanently maintained between positive and negative saturation.

U.S. Pat. No. 5,053,695 describes a circuit that periodically resets the flux level in the core of the current transformer from a saturated to an unsaturated state.

The similar method of controlling the current transformer is described in R. Severns, "Improving and simplifying HF DC current sensors", Proceedings of the 1986 IEEE Applied Power Electronics Conference (APEC 86), pp. 180 183. This publication describes a method that periodically excites the core of the current transformer into and out of a saturated state. This proposed technique improves the ability to measure current in any arbitrary direction and a way to force the core of the current transformer to go rapidly into and out of saturation for high and physically asymmetrical magnetic fields induced by the primary current in the primary winding, thereby greatly reducing losses and increasing the ability to measure high currents.

Another method is described in U.S. Pat. No. 5,811,965. This method includes the constant application of an AC voltage to the secondary winding of the current transformer. This ensures that the core of the transformer is in linear mode when measurements are performed.

U.S. Pat. No. 7,071,678 discloses the method of controlling the magnetic flux density in the current transformer to maintain a saturated transformer core between two successive measurements in the sampling measurement system. Saturation prevents the transformation of the primary current into the secondary current, thereby preventing losses in the secondary circuit during this condition. Both AC and DC current can be measured. The use of saturation allows the physical dimension of the transformer core to be reduced. To obtain efficient and accurate measurements with low power consumption, the magnetic fields originating from the primary current flowing in the primary winding and the external source must be symmetrically distributed in the magnetic core of the transformer. This severely limits the possible physical arrangement of the primary winding. The invention describes the method of dividing the secondary winding into two or more separate winding sections.

The German patent DE102012009243 describes the current sensor with a massive annular core made of soft magnetic material. The American patent application U.S. Pat. No. 4,023,100 describes a DC transformer having the primary winding to which a DC signal is connected, a core made of magnetically soft material and a secondary winding to which an electrically variable signal is applied with a polarity that changes whenever the core reaches saturation by means of a current measuring device connected with the transformer's secondary.

Japanese patent application JPH112646A describes the DC current sensor composed of the DC component detection core comprising an annular soft magnetic material around which the excitation coil and the DC current detection coil are wound, over which is arranged the conductor to be detected in the form of the toroidal coil and the AC current detection core consisting of the annular soft magnetic material around which is wound the AC current detection coil.

European patent application EP1494033A1 relates to the current transformer with one primary winding, one or more secondary windings wound on a core and transforming the primary current to secondary current as measured by the turns ratio.

Japanese patent application JPH0510980A relates to a leakage current detector, used as an overcurrent detector, which uses the magnetic phenomena of the iron core.

This American patent application U.S. Pat. No. 3,153,758 relates to the current comparator which is provided with two main windings, the detection winding, the deflection winding and the additional winding known as the excitation winding. The excitation winding is divided into two parts, these parts being located on opposite sides of the second magnetic core which extends parallel to the main magnetic core and preferably coaxially around it and is also closed on itself to form an infinite magnetic circuit.

The American publication US 2011/140694A1 describes a magnetic field circulation sensor comprising the elongated excitation coil extending around the elongated flexible magnetic core formed by the flexible magnetic material with low relative magnetic permeability and containing the flexible or elastic matrix in which magnetic particles are dispersed.

In general, all of the above methods based on the concentration of the magnetic field to the local magnetic field sensor location via the passive magnetic core have the disadvantage that the real core material is nonlinear, has only finite permeability and thus non-negligible magnetic resistance leading to the need for massive cores with significant space and power requirements at high implementation costs. Passive magnetic cores show significant measurement error in non-homogeneous magnetic fields.

The use of the amorphous wire as a magneto-impedance element is proposed in the U.S. Pat. No. 5,994,899. The magneto-impedance element consists of the amorphous wire having a helical magnetic anisotropy. Unidirectionally displaced alternating current is fed into the amorphous wire, and a voltage is generated between the two ends of the amorphous wire. The amplitude of this voltage is dependent on the externally applied magnetic field. This method is generally nonlinear and has a strongly limited amplitude range.

The disadvantage of magneto-impedance sensors in general is their dependence on external fields, temperature, part variation, etc., which severely limits their accuracy.

The newest state of the art also includes transducers based on fiber optic sensing elements, which use the magnetic and electric fields surrounding the conductor to modulate the state of light in optical crystals. The advantage of these systems is the inherent safety associated with fiber optics and the suppression of ambient electromagnetic interference. The disadvantage of the optical system is the sensitivity to external influences such as pressure, temperature gradients and mechanical vibrations along the fiber, which change the modulation sensitivity along the fiber and thus affect the transmission properties of the optical fiber. The main disadvantage of optical systems is their high cost.

Also known in the state of the art is the sensor and electric current sensor described in WO2015122855 A1. The sensor comprises the fiber of soft magnetic material having a uniform cross-sectional area and uniform magnetic properties along its entire length, which is provided with the excitation coil wound on said fiber having the uniform winding density along, substantially, its entire length. Alternatively, there is provided with the sensing coil wound on said fiber having a uniform winding density over substantially the entire length, wherein the ends of the fiber are mechanically coupled to form a loop surrounding the current conductor to be measured with said fiber. Said excitation coil is connected to the current output of the current source via the current transducer generating a current signal corresponding to the excitation current flowing through the excitation coil. The sensor is provided with the voltage transducer generating a voltage signal corresponding to a voltage on the possibly present sensing coil or on the excitation coil, wherein said voltage signal and said current signal are fed to the processing unit. The disadvantages of this sensor are the laborious manufacturing of the coil windings, the overall difficult assembly of the sensor, as well as the poor flexibility at higher cross-sections, the lower fatigue resistance to repeated bending, and at higher cross-sections the generation of eddy currents which counteract dynamic changes in the magnetic field.

The above mentioned state of the art implies the need to simplify the production of sensors and sensors capable of accurately measuring electric current, including its DC component, with negligible influence of the magnetic field distribution at the point of measurement on the accuracy of the measurement over a large range of current amplitudes and without the need to disconnect the measured current circuit with negligible space requirements for the installation of the sensor.

SUMMARY OF THE DISCLOSURE

In particular, the object of the present application is to design the planar electric current sensor and a sensor which also measures the DC component of the electric current with high accuracy even in a non-homogeneous magnetic field, which has low power consumption, which is easy to integrate into existing devices even without interrupting the current circuit, which would be suitable for mass production with low implementation costs, and which would also be easier to assemble in a real application.

This problem is solved by the present application, the substance of which is that the planar electric current sensor in the basic arrangement comprises a flexible strip of the homogeneous foil of magnetically soft material having a uniform cross-sectional area along the entire length of the strip with the maximum relative magnetic permeability value of at least 5000 due to achieving the fastest possible saturation of the magnetically soft material of the strip. For the purposes of the present application, the term “strip” is to be understood as a long shape with a small thickness which is less than its width.

The planar electric current sensor further comprises at least one excitation planar structure formed by transverse segments of electrically conductive material arranged above and below the flexible strip uniformly distributed along the length of the flexible strip, the outer surfaces of which are galvanically isolated from each other and which are first connecting elements electrically conductively coupled in series with each other such that these transverse segments, together with the first connecting elements of the excitation planar structure, continuously enclose the flexible strip and are functionally analogous to the homogeneous excitation winding around the flexible strip.

Advantageously, each excitation planar structure is provided with a return conductor supplying current from the end of the sensing structure to a location of the beginning of that structure. The return conductor of the excitation planar structure may be formed by an analogous excitation planar structure with a winding orientation opposite to the excitation planar structure.

The planar electric current sensor further comprises at least one sensing planar structure formed by transverse segments made of electrically conductive material arranged above and below the flexible strip uniformly spaced along the length of the flexible strip, the outer surfaces of which are galvanically isolated from each other and which are second connecting elements electrically conductively coupled in series with each other such that these transverse segments, together with the second connecting elements of the sensing planar structure, continuously surround the flexible strip and functionally form the homogeneous sensing winding around the flexible strip.

Preferably, each sensing planar structure is provided with the return conductor feeding a signal from an end of the sensing structure to a location at the beginning of the sensing structure. The return conductor of the sensing planar structure may be formed by the analogous sensing planar structure having the winding orientation opposite to the excitation planar structure.

The excitation planar structure, the sensing planar structure and the flexible strip are galvanically isolated from each other.

The flexible strip is provided with coupling means at its ends connecting the strip to an excitation planar structure and the sensing planar structure to form a closed loop surrounding the current conductor.

The mutual arrangement of the transverse segments of the excitation planar structure and the transverse segments of the sensing planar structure provides a number of possible implementations.

In one example, the transverse segments of the excitation planar structure and the transverse segments of the sensing planar structure are alternately disposed in one plane above the flexible strip and also in one plane below the flexible strip. The term 'alternately' means the planar structure transverse segments placed side by side . . . excitation, sensing, excitation, sensing . . . .

In another example, the number of transverse segments is multiplied such that the transverse segments of the sensing planar structure are interconnected to the transverse segments of the secondary sensing planar structure with the same directional winding orientation in one plane above the flexible strip and also in one plane below the flexible strip, which are arranged in such a way that the sensing planar structure and the secondary sensing planar structure are electrically conductively connected in series with the same directional winding orientation. Thereby, the first transverse segments of the sensing planar structure and the first transverse segments of the secondary sensing planar structure are arranged at the identical end of the flexible strip. This arrangement forms a symmetrical sensing planar structure with respect to the point of connection of the sensing planar structures, allowing for the elimination of external disturbances. For the purposes of the present application, the serial connection of the general planar structure and the secondary planar structure is to be understood as a connection wherein the last segment of the general planar structure is followed by the first segment of the secondary planar structure.

The transverse segments of the secondary sensing planar structure, the outer surfaces of which are galvanically isolated from each other, are the third connecting elements electrically conductively connected in series with each other such that these transverse segments of the secondary sensing planar structure, together with the third connecting elements, continuously surround the flexible strip to form the secondary sensing winding.

The outer surfaces of the transverse segments of the sensing planar structure and the outer surfaces of the transverse segments of the secondary sensing planar structure are galvanically isolated from each other. Also, the flexible strip, the excitation planar structure and the secondary sensing planar structure are galvanically isolated from each other.

Analogously, the transverse segments of the excitation planar structure are interconnected to the transverse segments of the secondary excitation planar structure with the same directional winding orientation in one plane above the flexible strip and in one plane below the flexible strip, which are arranged in such a way that the excitation planar structure and the secondary excitation planar structure are electrically conductively connected in series with the same directional winding orientation. Whereby the first transverse segments of the excitation planar structure and the first transverse segments of the secondary excitation planar structure are arranged at the identical end of the flexible strip.

The transverse segments of the secondary excitation planar structure, the outer surfaces of which are galvanically isolated from each other, are the fourth connecting elements electrically conductively connected to each other in series such that these transverse segments of the secondary excitation planar structure, together with the fourth connecting elements, continuously surround the flexible strip to form a secondary excitation winding.

The outer surfaces of the transverse segments of the excitation planar structure and the outer surfaces of the transverse segments of the secondary excitation planar structure are galvanically isolated from each other. The flexible strip, the sensing planar structure, and the secondary excitation planar structure are galvanically isolated from each other. The secondary excitation planar structure and any secondary sensing planar structure are galvanically isolated from each other.

When the planar structures are arranged separately in different planes above the flexible strip and in different planes below the flexible strip, the solution is provided where the transverse segments of the sensing planar structure are interconnected to the transverse segments of the secondary sensing planar structure, which are galvanically isolated from each other, with opposite directional orientation of the windings arranged separately in different planes above the flexible strip as well as separately in different planes below the flexible strip, which are further arranged in such a way that the sensing planar structure and the secondary sensing planar structure are electrically conductively connected in series with opposite directional orientation of the windings. Whereby the first transverse segments of the sensing planar structure and the first transverse segments of the secondary sensing planar structure are arranged at opposite ends of the flexible strip.

The transverse segments of the secondary sensing planar structure, the outer surfaces of which are galvanically isolated from each other, are the third connecting elements electrically conductively connected to each other in series such that these transverse segments of the secondary sensing planar structure, together with the third connecting elements, continuously surround the flexible strip and form the secondary sensing winding.

The outer surfaces of the transverse segments of the sensing planar structure and the outer surfaces of the transverse segments of the secondary sensing planar structure are galvanically isolated from each other. The flexible strip, the excitation planar structure and the secondary sensing planar structure are galvanically isolated from each other.

Analogously, the transverse segments of the excitation planar structure are interconnected to the transverse segments of the secondary excitation planar structure with opposite directional orientation of the winding arranged separately in different planes above the flexible strip as well as in separate different planes below the flexible strip, which are further arranged in such a way that the excitation planar structure and the secondary excitation planar structure are electrically conductively connected in series with the opposite directional orientation of the winding. Whereby the first transverse segments of the excitation planar structure and the first transverse segments of the secondary excitation planar structure are arranged at opposite ends of the flexible strip.

The transverse segments of the secondary excitation planar structure, the outer surfaces of which are galvanically isolated from each other, are the fourth connecting elements electrically conductively connected to each other in series so that these transverse segments of the secondary excitation planar structure, together with the fourth connecting elements, continuously surround the flexible strip and form the secondary excitation winding. The outer surfaces of the transverse segments of the excitation planar structure and the outer surfaces of the transverse segments of the secondary excitation planar structure are galvanically isolated from each other. The flexible strip, the sensing planar structure, the excitation planar structure and the secondary sensing planar structure are galvanically isolated from each other.

In another example, the mutual arrangement of the transverse segments of the excitation planar structure and the transverse segments of the sensing planar structure is arranged such that the transverse segments of the excitation planar structure and the transverse segments of the sensing planar structure are positioned above each other separately in different planes above the flexible strip and in different planes below the flexible strip. It is also possible for the transverse segments of the excitation planar structure and the transverse segments of the sensing planar structure to be arranged one above the other in overlapping.

For the purposes of the present application, the term "overlapped" is to be understood as meaning an arrangement of the respective portions of the transverse segments in which their geometric axes are one above the other. This arrangement increases the sampling density of the magnetic field and thereby increases the accuracy of the current measurement in the non-homogeneous magnetic field.

In order to eliminate external influences on the accuracy of the measurement, it is advantageous if the transverse segments of the uppermost planar structure located above and below the flexible strip are shielded from the outside of the sensor by transverse shielding segments arranged in such a way that these transverse shielding segments are electrically conductively connected to each other and to the sensing planar structure, the excitation planar structure, the possible secondary sensing planar structure, the possible secondary excitation planar structure are galvanically isolated from the transverse shielding segments. The mechanically separate transverse segments substantially increase the flexibility of the sensor as a whole.

For the subject matter described herein and all embodiments thereof, it is advantageous to achieve the most accurate measurement in the transverse segments of the sensing planar structure to achieve the best possible coupling to the excitation current in the excitation planar structure along the entire length of the sensing planar structure. Preferably, the arrangement in which the transverse segments of the sensing planar structure have identical dimensions, are of identical material, and are possibly overlapped, provides the best conformity.

The exact dimensions of individual relevant parts such as connecting elements or their possible different material outside these transverse segments of the sensing planar structure do not have a significant influence on the conformity. The accuracy of the magnetic field sampling along the planar sensor is directly proportional to the number (density) of transverse segments of the excitation and sensing planar structure arranged on the flexible strip of the homogeneous foil of magnetically soft material.

Specifically, the use of the planar electric current sensor is to connect the excitation planar structure or the excitation planar structure and the secondary excitation planar structure that are connected in series to the output of the electric current source via the current transducer. The current transducer generates a current signal corresponding to the excitation current flowing through the excitation planar structure. Preferably, the current transducer is provided with a low-pass filter suppressing the high frequency content of the processed current.

The sensor is further provided with a voltage transducer that generates a voltage signal that monitors the voltage in the sensing planar structure or the sensing planar structure and the secondary sensing planar structure, which are connected in series. Preferably, the voltage converter is provided with a low-pass filter suppressing the high frequency content of the processed voltage. The current signal and the voltage signal are fed to the processing unit.

The current source is adapted to generate a current with a value oscillating between two limit values. These limit values may be fixed prior to the measurement procedure or may be adjusted dynamically during the measurement procedure depending on the magnetization state of the strip of magnetically soft material. The oscillation is maintained so that when any of the two limit values is reached, the steepness of the current is adjusted towards the second current limit value.

The current limit values are set so that the output current value reaching the excitation of the first current limit is able to excite, including the external magnetic field, the entire volume of the magnetic material of the strip to a saturated state. The second current limit has a value at which the excitation current is capable to excite, including the external magnetic field, the entire volume of the magnetic material of the strip into the oppositely oriented saturated state.

Finally, the planar electric current sensor for all of the implementations described herein is advantageously arranged to have a metal shielding on one or both sides, electrically isolated from other parts of the planar sensor to minimize the influence of an external fault electric field.

The value of the measured electric current is calculated from a certain integral of the time function of the product of the instantaneous values of the excitation current and the voltage induced by the magnetic field into the planar sensing system of the planar electric current sensor.

$$\int_{T_1}^{T_2} I_i(t) U_i(t)\, dt$$

Meaning of the symbols used:

$U_i(t)$—is the time function of the induced voltage $I_i(t)$—is the time function of the excitation current $T_1$—is the time of the start of integration $T_2$—is the time of the end of integration The time of the start of integration is the time when the excitation current value is within one limiting value at which the entire volume of the soft magnetic strip material is in a state of magnetic saturation and is moving towards the second limiting value.

The end of integration time is the time at which the excitation current value reaches this second limit value, at which point the entire volume of the soft magnetic strip material is in a state of oppositely oriented magnetic saturation.

More accurate method of measuring the electric current for the electric current sensor uses the calculation of the electric current value from the ratio of the certain integral of the time function of the product of instantaneous values of the excitation current and the voltage induced by the magnetic field into the present sensing planar structure or the excitation planar structure, and the certain integral of the time function of the voltage induced by the magnetic field into the sensing planar structure or the excitation planar structure. Both integrals are integrated over the same time interval:

$$\frac{\int_{T_1}^{T_2} I_i(t)U_i(t)\,dt}{\int_{T_1}^{T_2} U_i(t)\,dt}$$

Preferably, the value of the electric current is calculated as the average value of the currents calculated by one of the preceding methods at mutually opposite signs of the steepness of the excitation current time function.

The advantages of a planar electric current sensor according to the present application compared to the sensor formed by the fiber of the soft magnetic material of circular cross-section with wound excitation and sensing windings at the same cross-sectional area of the magnetic material can be summarized as follows: reducing the thickness of the strip increases the flexibility and bendability of the sensor and hence the possibility of reducing the diameter of the closed sensor circle surrounding the conductor of the current to be measured, which increases the magnetic field strength and hence increases the sensitivity of the sensor, and further:

- increases fatigue resistance when the strip bends, increasing the life of the sensor during repeated opening/closing cycles;
- increases the accuracy of a sensor placed in the non-homogeneous magnetic field due to better approximation of the definitional line integration of the magnetic field around the conductor of the measured current;
- reduces the reverse influence of eddy currents in the strip cross-section on the dynamic measured and excitation magnetic field;
- compared to the circular cross-section of the fiber, the circumference of the strip is larger for the same cross-sectional area and hence the total surface area is larger for the same length, which leads to an increase in the sensor area and consequently increases the heat removal generated by the excitation current in the excitation structure, thus allowing an increase in the excitation current, which directly leads to an increase in the maximum possible current to be measured;

Preferably, the arrangement of the excitation and/or sensing planar structure is such that they are formed by analogous planar structures with the same or opposite winding orientation resulting in the need for less excitation current to the excitation planar structure for a given measured current and an increase in the voltage across the sensing planar structure and hence an increase in the sensitivity of the measurement.

An even number of sensing planar structures creates a symmetric sensing structure with regard to their connection point, allowing the elimination of external disturbances.

Another advantage is the fact that the use of transverse segments of planar structures produced by lithographic manufacturing processes allows a high degree of accurate reproduction of their shape as well as their precise distribution, which increases the accuracy of the integration of the non-homogeneous magnetic field.

If the start and end of the planar structures and the serial connection of the structures, respectively, are arranged at the identical end of the flexible strip, this allows the sensor to be non-invasively connected in a loop without the need to disconnect the measured current conductor.

SUMMARY OF THE DRAWINGS

The planar electric current sensor and sensor designed according to the present application is shown in the drawings, in which.

DETAILED DESCRIPTION OF THE DISCLOSURE

The following specific examples of embodiments are provided for illustrative purposes only and should not be understood as limitations on the scope of protection provided by the patent claims.

Example 1

Figure 1:
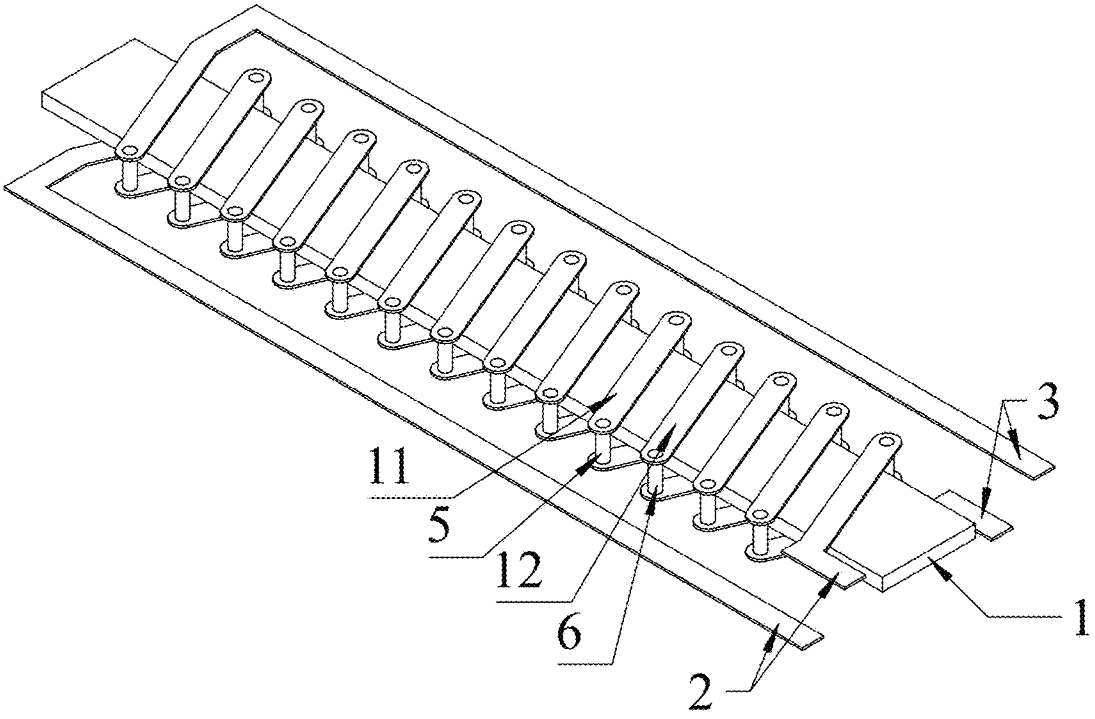
FIG. 1 shows the planar sensor in which the strip of the homogeneous foil of magnetically soft material is surrounded by one excitation planar structure and one sensing planar structure located side by side.

The basic arrangement of a planar electric current sensor suitable for measuring large currents is shown in FIG. 1. It comprises the flexible strip 1 made of the homogeneous foil of magnetically soft material with the uniform cross-sectional area along the entire length of the strip 1.

It also comprises an excitation planar structure 2 formed by transverse segments 11 of electrically conductive material arranged above and below the flexible strip 1 uniformly distributed along the entire length of the flexible strip 1, the outer surfaces of which are galvanically isolated from each other and which are first connecting elements 5 electrically conductively coupled in series with each other so that the excitation planar structure 2 formed by the transverse segments 11 together with the first connecting elements 5 continuously surrounds the flexible strip 1 to form the excitation winding.

It also comprises the sensing planar structure 3 formed by transverse segments 12 of electrically conductive material arranged above and below the flexible strip 1 uniformly distributed along the entire length of the flexible strip 1, the outer surfaces of which are galvanically isolated from each other and which are electrically conductively connected in series with each other by second connecting elements 6, so that the sensing planar structure 3 formed by the transverse segments 12 together with the second connecting elements 6 continuously surrounds the flexible strip 1 and thus forms the sensing winding.

The transverse segments 11 of the excitation planar structure 2 and the transverse segments 12 of the sensing planar structure 3 are alternately arranged with the same directional orientation in one plane above the flexible strip 1 and also in one plane below the flexible strip 1.

The outer surfaces of the transverse segments 11 of the excitation planar structure 2 and the outer surfaces of the transverse segments 12 of the sensing planar structure 3 and the flexible strip 1 are galvanically isolated from each other. Also, the excitation planar structure 2, the sensing planar structure 3 and the flexible strip 1 are galvanically isolated from each other. This arrangement of the planar sector simplifies its production and thus the manufacturing cost.

Example 2

Figure 2:
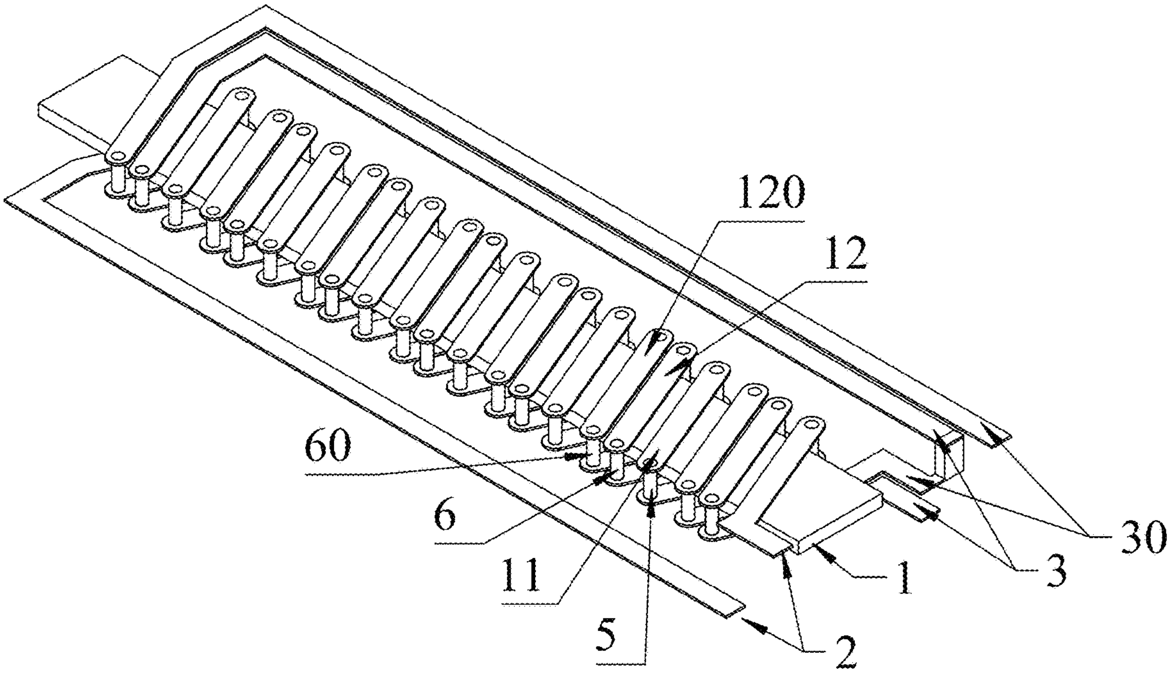
FIG. 2 shows the planar sensor in which the strip of the homogeneous foil of magnetically soft material is surrounded by one excitation planar structure and two sensing planar structures located side by side.

The analogous arrangement of the planar electric current sensor is shown in FIG. 2. It comprises the flexible strip 1 made of the homogeneous foil of magnetically soft material with the uniform cross-sectional area along the entire length of the strip 1.

It also comprises the excitation planar structure 2 formed by transverse segments 11 of electrically conductive material arranged above and below the flexible strip 1 evenly spaced along the entire length of the flexible strip 1, the outer surfaces of which are galvanically isolated from each other, and which are first connecting elements 5 electrically conductively connected in series with each other so that the excitation planar structure 2 formed by the transverse segments 11 together with the first connecting elements 5 continuously surrounds the flexible strip 1.

It also includes the sensing planar structure 3 formed by transverse segments 12 and a secondary sensing planar structure 30 formed by transverse segments 120 of electrically conductive material arranged above and below the flexible strip 1 uniformly distributed along the entire length of the flexible strip 1.

The transverse segments 120 of the secondary sensing planar structure 30, the outer surfaces of which are galvanically isolated from each other, are electrically conductively connected in series with each other by the third connecting elements 60 such that these transverse segments 120 of the secondary sensing planar structure 30, together with the third connecting elements 60, continuously surround the flexible strip 1 and form a secondary sensing winding.

The transverse segments 12 of the sensing planar structure 3 are second connecting elements 6 electrically conductively connected to each other in series, so that both of them, in series, continuously surround the flexible strip 1. The place of connection of the sensing planar structure 3 and the secondary sensing planar structure 30 in series is realized by a conductive connection.

The arrangement is further arranged such that the transverse segments 12 of the sensing planar structure 3 are galvanically connected to the transverse segments 120 of the secondary sensing planar structure 30 with the same directional winding orientation in the plane above the flexible strip 1 and also in the plane below the flexible strip 1, which are arranged in such a way that the sensing planar structure 3 and the secondary sensing planar structure 30 are electrically conductively connected in series with the same directional winding orientation.

Herein, the first transverse segments 12 of the sensing planar structure 3 and the first transverse segments 120 of the secondary sensing planar structure 30 are arranged at an identical end of the flexible strip 1. The outer surfaces of the transverse segments 11 of the excitation planar structure 2, the outer surfaces of the transverse segments 12 of the sensing planar structure 3, the outer surfaces of the transverse segments 120 of the secondary sensing planar structure 30, and the flexible strip 1 are galvanically isolated from each other.

This arrangement of the sensing winding is symmetrical, which allows the elimination of disturbance effects.

A planar sensor with an excitation planar structure 2 with segments 11 and a secondary excitation planar structure 20 with segments 110 is arranged analogously, which is not shown in any of the figures.

Example 3

Figure 3:
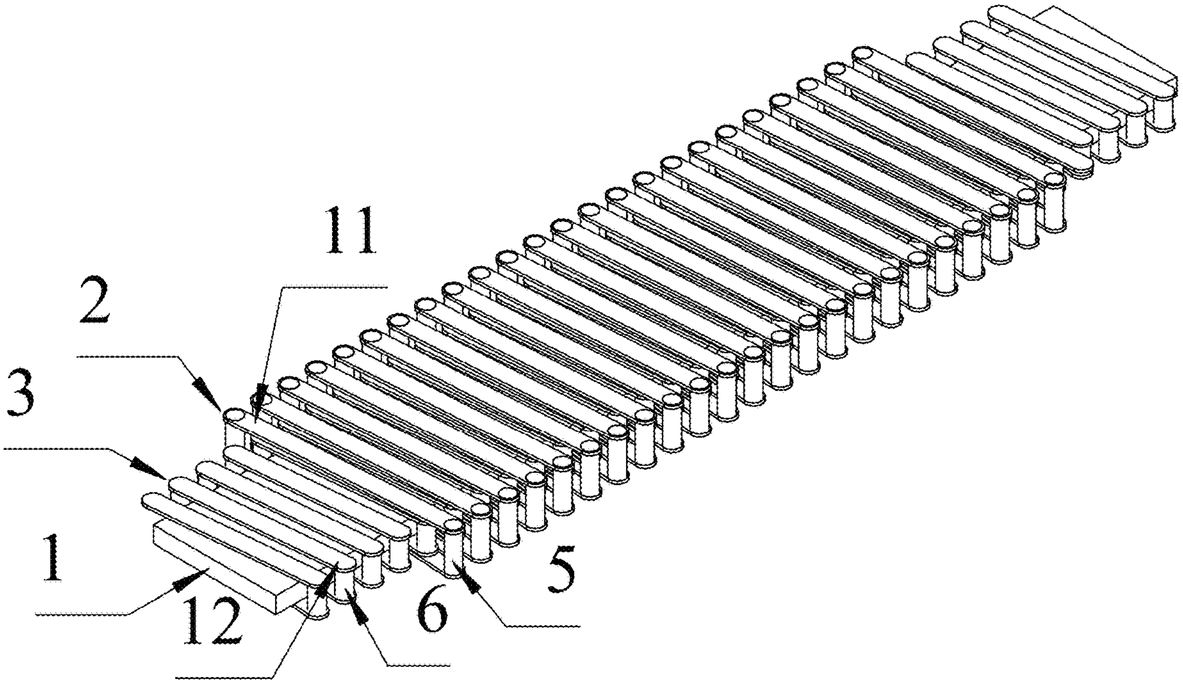
FIG. 3 shows the planar sensor in which the strip of the homogeneous foil of magnetically soft material is surrounded by one excitation planar structure and one sensing planar structure located one above the other.

In the following example, a further arrangement of the planar electric current sensor is described as shown in FIG. 3. It comprises the flexible strip 1 made of the homogeneous foil of magnetically soft material with the uniform cross-sectional area along the entire length of the strip 1.

It also comprises the excitation planar structure 2 formed by transverse segments 11 of electrically conductive material arranged above and below the flexible strip 1 uniformly arranged along the entire length of the flexible strip 1, which are first connecting elements 5 galvanically connected in series with each other so that the excitation planar structure 2 continuously surrounds the flexible strip 1.

It also comprises a sensing planar structure 3 formed by transverse segments 12 of electrically conductive material arranged above and below the flexible strip 1 uniformly arranged along the entire length of the flexible strip 1, which are second connecting elements 6 galvanically connected in series with each other such that the sensing planar structure 3 continuously surrounds the flexible strip 1. The mutual arrangement of the transverse segments 11 of the excitation planar structure 2 and the transverse segments 12 of the sensing planar structure 3 is solved in such a way that the transverse segments 11 of the excitation planar structure 2 and the transverse segments 12 of the sensing planar structure 3 are arranged above each other separately in two planes above the flexible strip 1 and in two planes below the flexible strip 1.

The outer surfaces of the transverse segments 11 of the excitation planar structure 2 and the outer surfaces of the transverse segments 12 of the sensing planar structure 3 and the flexible strip 1 are galvanically isolated from each other. The excitation planar structure 2, the sensing planar structure 3 and the flexible strip 1 are also galvanically isolated from each other.

In an alternative solution, the transverse segments 11 of the excitation planar structure 2 and the transverse segments 12 of the sensing planar structure 3 are arranged one above the other in the overlapping arrangement. Such arrangement of the planar sensor allows a higher effective winding density which allows to improve the accuracy of the integration of the non-homogeneous magnetic field and to increase the value of the measured current.

Example 4

In this next example, another arrangement of the planar electric current sensor is described, which is no longer shown in any of the figures due to its complexity.

It comprises the flexible strip 1 made of the homogeneous foil of magnetically soft material with the uniform cross-sectional area along the entire length of the strip 1. It comprises the sensing planar structure 3 and the secondary sensing planar structure 30, wherein the transverse segments 12 of the sensing planar structure 3 are interconnected to the transverse segments 120 of the secondary sensing planar structure 30 with the same directional winding orientation in one plane above the flexible strip 1 and also in one plane below the flexible strip 1, which are arranged in such a way that the sensing planar structure 3 and the secondary sensing planar structure 30 are electrically conductively connected in series with the same directional winding orientation.

Thereby, the first transverse segments 12 of the sensing planar structure 3 and the first transverse segments 120 of the secondary sensing planar structure 30 are arranged at the identical end of the flexible strip 1. The transverse segments 120 of the secondary sensing planar structure 30, the outer surfaces of which are galvanically isolated from each other, are electrically conductively connected in series with each other by third connecting elements 60, so that these transverse segments 120 of the secondary sensing planar structure 30 together with the third connecting elements 60 continuously surround the flexible strip 1 and form a secondary sensing winding.

The outer surfaces of the transverse segments 12 of the sensing planar structure 3 and the outer surfaces of the transverse segments 120 of the secondary sensing planar structure 30 are galvanically isolated from each other.

The flexible strip 1, the excitation planar structure 2 and the secondary sensing planar structure 30 are galvanically isolated from each other.

Further comprises the excitation planar structure 2 and the secondary excitation planar structure 20, wherein the transverse segments 11 of the excitation planar structure 2 are interconnected to the transverse segments 110 of the secondary excitation planar structure 20 with the same directional orientation of the winding in one plane above the flexible strip 1 and in one plane below the flexible strip 1, which are arranged in such a way that the excitation planar structure 2 and the secondary excitation planar structure 20 are electrically conductively connected in series with the same directional winding orientation.

Thereby, the first transverse segments 11 of the excitation planar structure 2 and the first transverse segments 110 of the secondary excitation planar structure 20 are arranged at an identical end of the flexible strip 1. The transverse segments 110 of the secondary excitation planar structure 20, the outer surfaces of which are galvanically isolated from each other, are fourth connecting elements 50 electrically conductively connected in series with each other so that these transverse segments 110 of the secondary excitation planar structure 20 together with the fourth connecting elements 50 continuously surround the flexible strip 1 and form a secondary excitation winding.

The outer surfaces of the transverse segments 11 of the excitation planar structure 2 and the outer surfaces of the transverse segments 110 of the secondary excitation planar structure 20 are galvanically isolated from each other. The flexible strip 1, the sensing planar structure 3, and the secondary excitation planar structure 20 are galvanically isolated from each other. The secondary excitation planar structure 20 and any secondary sensing planar structure 30 are galvanically isolated from each other.

Example 5

In this next example, another arrangement of the planar electric current sensor is described, which is no longer shown in any of the figures due to its complexity.

It comprises the flexible strip 1 made of the homogeneous foil of magnetically soft material with the same cross-sectional area along the entire length of the strip 1. It comprises the sensing planar structure 3 and the secondary sensing planar structure 30, wherein the transverse segments 12 of the sensing planar structure 3 are interconnected to the transverse segments 120 of the secondary sensing planar structure 30, which are galvanically isolated from each other with the opposite directional orientation of the windings arranged separately in different planes above the flexible strip 1 as well as separately in different planes below the flexible strip 1.

These are further arranged such that the sensing planar structure 3 and the secondary sensing planar structure 30 are electrically conductively connected in series with opposite directional orientation of the windings, wherein the first transverse segments 12 of the sensing planar structure 3 and the first transverse segments 120 of the secondary sensing planar structure 30 are arranged at opposite ends of the flexible strip 1.

The transverse segments 120 of the secondary sensing planar structure 30, the outer surfaces of which are galvanically isolated from each other, are electrically conductively connected in series with each other by the third connecting elements 60 such that these transverse segments 120 of the secondary sensing planar structure 30, together with the third connecting elements 60, continuously surround the flexible strip 1 and form a secondary sensing winding.

The outer surfaces of the transverse segments 12 of the sensing planar structure 3 and the outer surfaces of the transverse segments 120 of the secondary sensing planar structure 30 are galvanically isolated from each other. The flexible strip 1, the excitation planar structure 2 and the secondary sensing planar structure 30 are galvanically isolated from each other.

Further comprises the excitation planar structure 2 and the secondary excitation planar structure 20, wherein the transverse segments 11 of the excitation planar structure 2 are interconnected to the transverse segments 110 of the secondary excitation planar structure 20 with opposite directional orientation of the windings arranged separately in different planes above the flexible strip 1 as well as in separately in different planes below the flexible strip 1, which are further arranged in such a way that the excitation planar structure 2 and the secondary excitation planar structure 20 are electrically conductively connected in series with opposite directional winding orientation.

Thereby, the first transverse segments 11 of the excitation planar structure 2 and the first transverse segments 110 of the secondary excitation planar structure 20 are arranged at opposite ends of the flexible strip 1. The transverse segments 110 of the secondary excitation planar structure 20, the outer surfaces of which are galvanically isolated from each other, are the fourth connecting elements 50 electrically conductively connected in series with each other so that these transverse segments 110 of the secondary excitation planar structure 20 together with the fourth connecting elements 50 continuously surround the flexible strip 1 and form the secondary excitation winding.

The outer surfaces of the transverse segments 11 of the excitation planar structure 2 and the outer surfaces of the transverse segments 110 of the secondary excitation planar structure 20 are galvanically isolated from each other. The flexible strip 1, the sensing planar structure 3, the excitation planar structure 2 and the secondary sensing planar structure 30 are galvanically isolated from each other.

Figure 7:
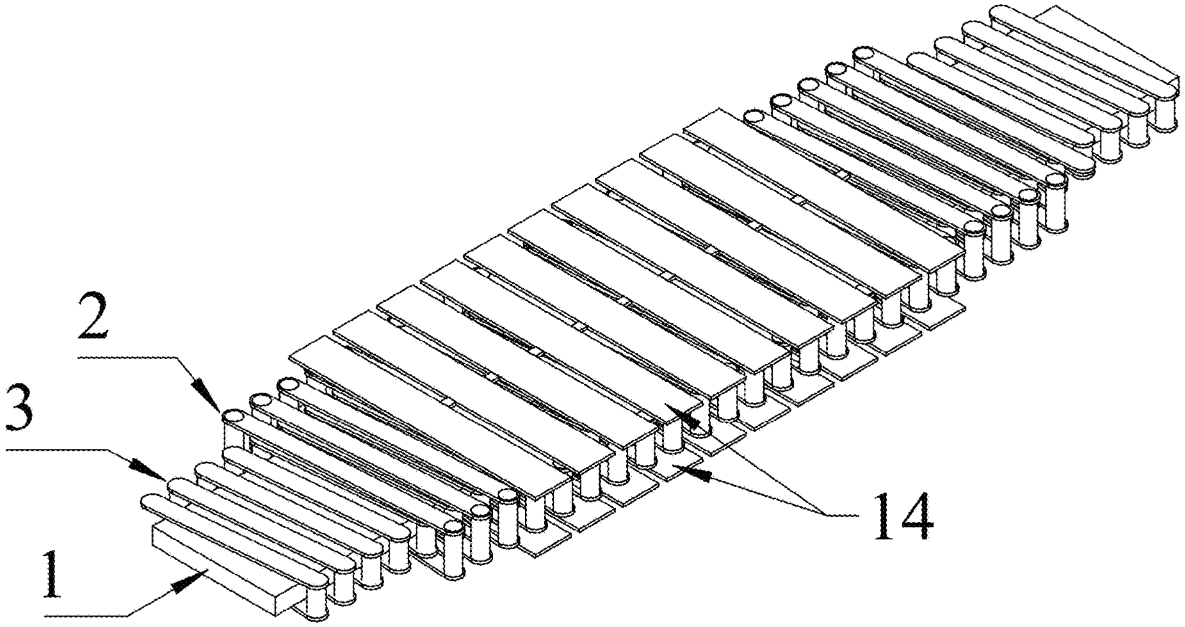
FIG. 7 shows the segments of the uppermost sensing planar structure located above and below the flexible strip, which are shielded from the outside of the sensor by transverse shielding segments and are electrically conductively connected to each other.

For all of the above implementations, it is true that the specifically applied transverse segments 11, 12, 110, 120 of the uppermost specifically applied planar structure 2, 3, 20, 30 positioned above and below the flexible strip 1 are shielded from the outside of the sensor by transverse shielding segments 14 arranged in such a manner, that these transverse shielding segments 14 are galvanically connected to each other and are also galvanically isolated from the sensing planar structure 3 or from the excitation planar structure 2 or optionally from the secondary sensing planar structure 30, optionally also to the secondary excitation planar structure 20 as shown in principle in FIG. 7.

Example 6

Figure 4:
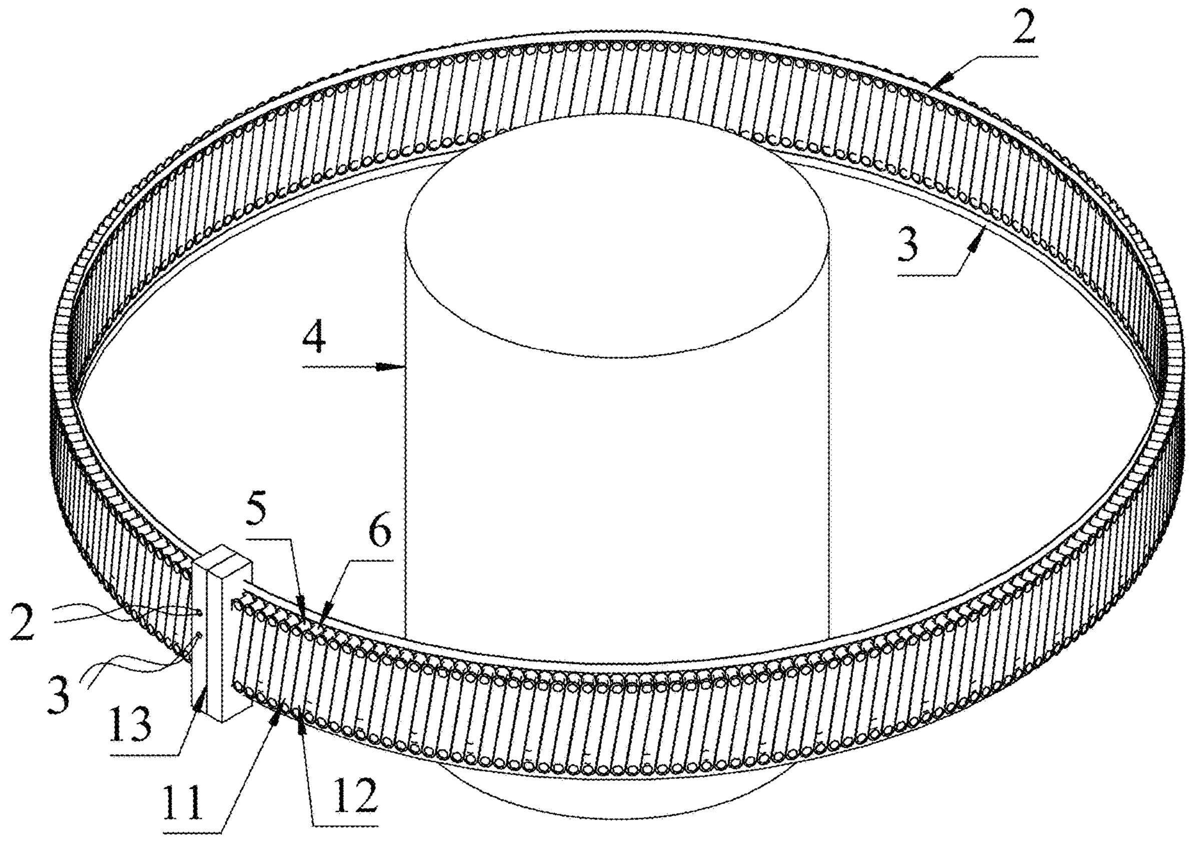
FIG. 4 shows the planar electric current sensor arranged so that the ends of the flexible strip are provided with a coupling means to enable an openable closed loop to be formed around the conductor with the current to be measured.

The planar electric current sensor illustrated in FIG. 4 shows the planar electric current sensor according to Example 1 advantageously arranged such that the flexible strip 1 with the applied excitation planar structure 2 formed by the transverse segments 11 and the first connecting elements 5, and the sensing planar structure 3 formed by the transverse segments 12 and the second connecting elements 6, is provided at its ends with connecting means 13 for forming the closed loop surrounding the current conductor 4. The conductors of the excitation planar structure 2 and the conductors of the sensing planar structure 3 are then led out from the connecting means.

Example 7

Figure 5:
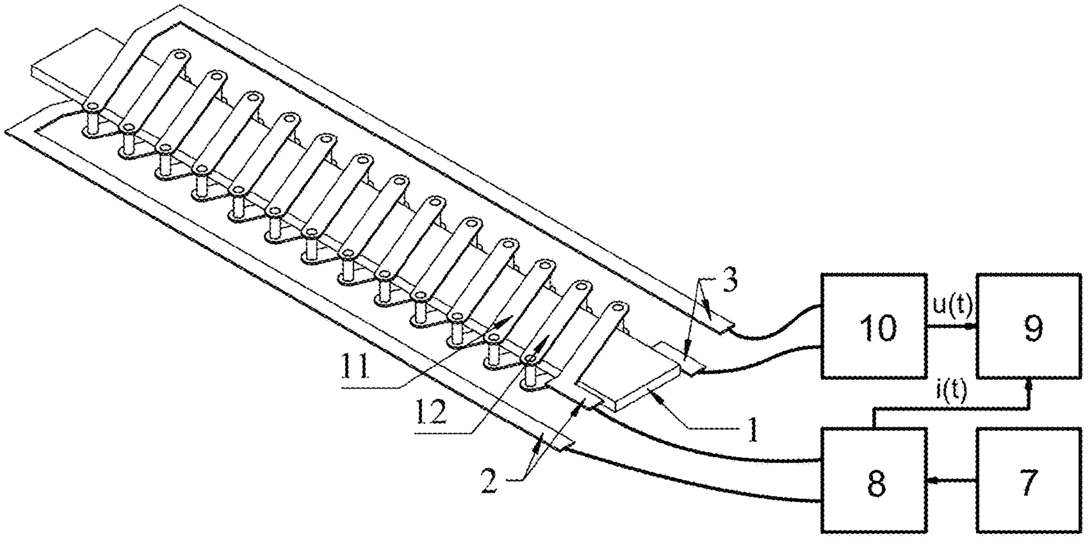
FIG. 5 shows the electric current sensor in which planar sensor elements are connected to electronic circuits.
Figure 6:
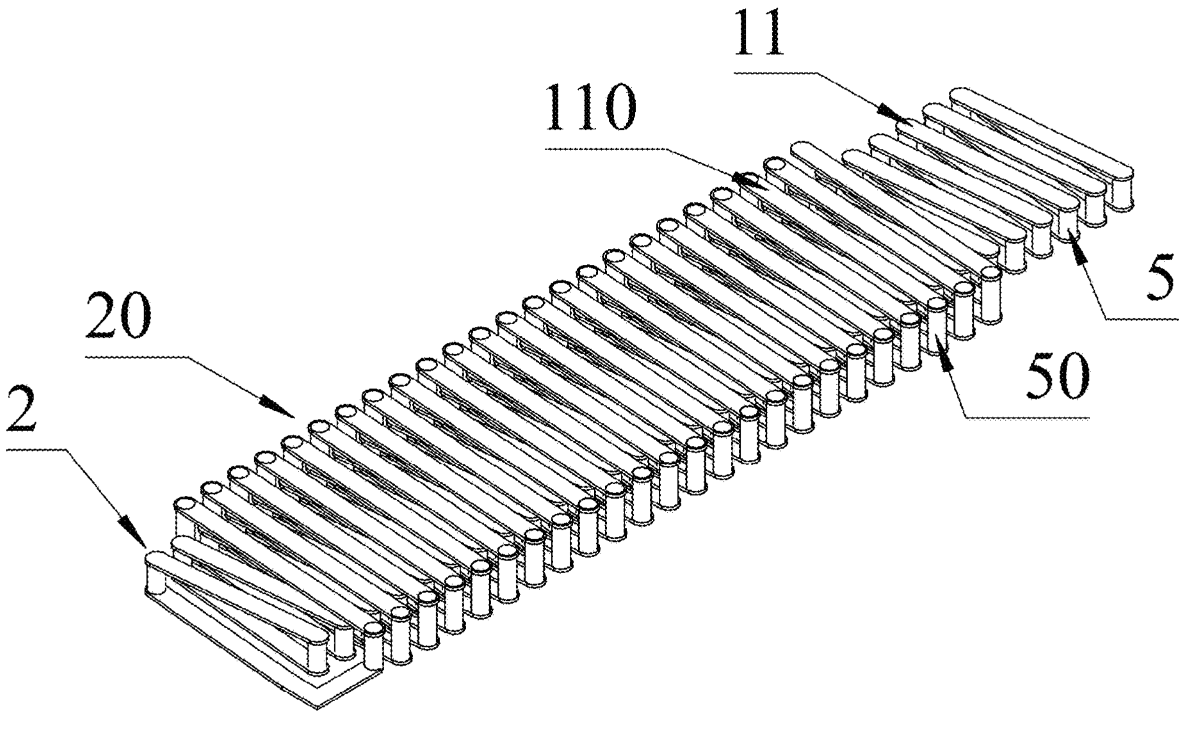
FIG. 6 shows the mutually opposite directional orientation of the windings of the excitation planar structure and the secondary excitation planar structure.

All of the above-described examples of embodiments of a planar sensor for measuring electric current are adapted to connect electronic circuits, wherein this connection forms an electric current sensor as shown in FIG. 5.

The electronic circuitry includes a current source 7 connected to a current transducer 8, to which an excitation planar structure 2 of the transverse segments 11 is connected. The current source 7 generates an excitation current to the excitation planar structure 2 of the transverse segments 12. The excitation current passes through the current transducer 8 which generates a current signal i(t) corresponding to the excitation current.

Further, the electronic circuitry includes the voltage transducer 10 to which the sensing planar structure 3 is connected. The voltage transducer 10 produces a voltage signal u(t) corresponding to the voltage induced from the planar sensing structure by the magnetic field. Finally, it comprises the processing unit 9 interconnected with the voltage converter 10 and the current converter 8. The current signal i(t) and the voltage signal u(t) are fed to the processing unit 9.

INDUSTRIAL APPLICABILITY

The planar sensor and electric current sensor solution according to the present application is intended for use in control and monitoring systems in a various industrial applications requiring high-precision measurement of electric current, including its DC component.

LIST OF REFERENCE NUMBERS

1 flexible strip made of homogeneous foil of magnetically soft material
2 excitation planar structure
20 secondary excitation planar structure
3 sensing planar structure
30 secondary sensing planar structure
4 current conductor
5 the first connecting element
50 the fourth connecting element
6 the second connecting element
60 the third connecting element
7 current source
8 current transducer
9 processor unit
10 voltage transducer
11 segment of the excitation planar structure
110 segment of secondary excitation planar structures
12 segment of the sensing planar structure
120 segment of the secondary sensing planar structure
13 connecting means
14 transverse shielding segments

What is claimed:

1. A planar electric current sensor suitable for DC component measurement, comprising:

a flexible strip made of a homogeneous foil of magnetically soft material with a uniform cross-sectional area along an entire length of the strip;

an excitation planar structure comprising transverse segments of electrically conductive material arranged above and below the flexible strip uniformly distributed along the entire length of the flexible strip, outer surfaces of which are galvanically isolated from each other and which are by a first connecting elements electrically conductively connected in series with each other so that these transverse segments together with the first connecting elements continuously surround the flexible strip and form an excitation winding; and a sensing planar structure comprising a transverse segments of electrically conductive material arranged above and below the flexible strip, distributed uniformly along the entire length of the flexible strip, the outer surfaces of which are galvanically isolated from each other and which are electrically conductively connected in series with each other by a second connecting elements such that these transverse segments together with the second connecting elements continuously surround the flexible strip and form a sensing winding;

the excitation planar structure, the sensing planar structure and the flexible strip are galvanically isolated from each other; and the flexible strip is provided with connecting means at its ends so to form a closed loop surrounding a current conductor.

2. The planar electric current sensor according to claim 1, wherein:

the transverse segments of the excitation planar structure and the transverse segments of the sensing planar structure are alternately arranged in one plane above the flexible strip and also in one plane below the flexible strip.

3. The planar electric current sensor according to claim 1, wherein:

the transverse segments of the excitation planar structure and the transverse segments of the sensing planar structure are arranged above each other separately in different planes above the flexible strip and in different planes below the flexible strip.

4. The planar electric current sensor according to claim 1, wherein:

the transverse segments of the sensing planar structure are interconnected to transverse segments of a secondary sensing planar structure, with the same directional orientation of the winding in one plane above the flexible strip and also in one plane below the flexible strip, which are arranged in such a manner, that the sensing planar structure and the secondary sensing planar structure are electrically conductively connected in series with the same directional orientation of the winding, and where the first transverse segments of the sensing planar structure and the first transverse segments of the secondary sensing planar structure are arranged at an identical end of the flexible strip;

the transverse segments of the secondary sensing planar structure, the outer surfaces of which are galvanically isolated from each other, are electrically conductively connected in series with each other by a third connecting elements, so that these transverse segments of the secondary sensing planar structure together with the third connecting elements continuously surround the flexible strip and form the secondary sensing winding;

the outer surfaces of the transverse segments of the sensing planar structure and the outer surfaces of the transverse segments of the secondary sensing planar structure are galvanically isolated from each other; and the flexible strip, the excitation planar structure and the secondary sensing planar structure are galvanically isolated from each other.

5. The planar electric current sensor according to claim 4, wherein:

the transverse segments of the excitation planar structure are interconnected to a transverse segments of a secondary excitation planar structure with the same directional orientation of the winding in one plane above the flexible strip and in one plane below the flexible strip, which are arranged in such a manner, that the excitation planar structure and the secondary excitation planar structure are electrically conductively connected in series with the same directional winding orientation, and where the first transverse segments of the excitation planar structure and the first transverse segments of the secondary excitation planar structure are arranged at an identical end of the flexible strip;

the transverse segments of the secondary excitation planar structure, the outer surfaces of which are galvanically isolated from each other, are electrically conductively connected in series with each other by fourth connecting elements, so that these transverse segments of the secondary excitation planar structure together with the fourth connecting elements continuously surround the flexible strip and form the secondary excitation winding;

the outer surfaces of the transverse segments of the excitation planar structure and the outer surfaces of the transverse segments of the secondary excitation planar structure are galvanically isolated from each other;

the flexible strip, the sensing planar structure, and the secondary excitation planar structure are galvanically isolated from each other; and the secondary excitation planar structure and any secondary sensing planar structure are galvanically isolated from each other.

6. Planar electric current sensor to claim 5, wherein:

the transverse segments of the sensing planar structure are interconnected to the transverse segments of a secondary sensing planar structure, which are galvanically isolated from each other, with the opposite directional orientation of the windings arranged above each other separately in different planes above the flexible strip as well as separately in different planes below the flexible strip, which are further arranged in such a way that the sensing planar structure and the secondary sensing planar structure are electrically conductively connected in series with opposite directional orientation of the windings, wherein the first transverse segments of the sensing planar structure and the first transverse segments of the secondary sensing planar structure are arranged at opposite ends of the flexible strip;

the transverse segments of the secondary sensing planar structure, the outer surfaces of which are galvanically isolated from each other, are electrically conductively connected in series with each other by the third connecting elements, so that these transverse segments of the secondary sensing planar structure together with the third connecting elements continuously surround the flexible strip and form a secondary sensing winding;

the outer surfaces of the transverse segments of the sensing planar structure and the outer surfaces of the transverse segments of the secondary sensing planar structure are galvanically isolated from each other; and the flexible strip, the excitation planar structure and the secondary sensing planar structure are galvanically isolated from each other.

7. The planar electric current sensor according to claim 6, wherein:

the transverse segments of the excitation planar structure are interconnected to the transverse segments of a secondary excitation planar structure with opposite directional orientation of the windings arranged separately in different planes above the flexible strip as well as in different planes below the flexible strip, which are further arranged in such a manner, that the excitation planar structure and the secondary excitation planar structure are electrically conductively connected in series with opposite directional orientation of the windings, the first transverse segments of the excitation planar structure and the first transverse segments of the secondary excitation planar structure are arranged at opposite ends of the flexible strip;

the transverse segments of the secondary excitation planar structure, the outer surfaces of which are galvanically isolated from each other, are electrically conductively connected in series with each other by the fourth connecting elements, so that these transverse segments of the secondary excitation planar structure together with the fourth connecting elements continuously surround the flexible strip and form the secondary excitation winding;

the outer surfaces of the transverse segments of the excitation planar structure and the outer surfaces of the transverse segments of the secondary excitation planar structure are galvanically isolated from each other; and the flexible strip, the sensing planar structure, the excitation planar structure and the secondary sensing planar structure are galvanically isolated from each other.

8. The planar electric current sensor according to claim 6, wherein:

the transverse segments of the uppermost planar structure located above and below the flexible strip are shielded from the outside of the sensor by transverse shielding segments arranged in such a way that these transverse shielding segments are electrically conductively connected to each other and the sensing planar structure, the excitation planar structure, the possible secondary sensing planar structure, the possible secondary excitation planar structure are galvanically isolated from the transverse shielding segments.

9. An electric current sensor, comprising a planar electric current sensor according to claim 1, which is interfaced with electronic circuitry comprising:

a current source connected to a current transducer, to which the excitation planar structure is connected;

a voltage transducer to which the sensing planar structure is connected; and a processing unit connected with the voltage converter and the current converter.

* * * * *